US012200893B2

(12) United States Patent
Huang et al.

(10) Patent No.: US 12,200,893 B2
(45) Date of Patent: Jan. 14, 2025

(54) ENGAGING MECHANISM

(71) Applicant: Wiwynn Corporation, New Taipei (TW)

(72) Inventors: Wei-Li Huang, New Taipei (TW); Hung-Lung Lin, New Taipei (TW); Yan-Yu Chen, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 171 days.

(21) Appl. No.: 17/865,409

(22) Filed: Jul. 15, 2022

(65) Prior Publication Data
US 2023/0422422 A1 Dec. 28, 2023

(30) Foreign Application Priority Data
Jun. 28, 2022 (TW) .................................. 111124005

(51) Int. Cl.
| *H05K 7/14* | (2006.01) |
| *G06F 1/18* | (2006.01) |
| *H05K 5/02* | (2006.01) |

(52) U.S. Cl.
CPC ......... *H05K 7/1489* (2013.01); *H05K 5/0221* (2013.01); *H05K 7/1487* (2013.01); *G06F 1/186* (2013.01)

(58) Field of Classification Search
CPC .. H05K 7/1489; H05K 7/1487; H05K 5/0221; H05K 5/023; G06F 1/183; G06F 1/186; G06F 1/187
See application file for complete search history.

(56) References Cited

U.S. PATENT DOCUMENTS

| 9,826,658 | B1 * | 11/2017 | Mao | ........................ G06F 1/183 |
| 10,251,300 | B1 * | 4/2019 | Mao | ..................... H05K 7/1487 |
| 10,423,198 | B1 * | 9/2019 | Tsai | ...................... H05K 7/1487 |
| 10,470,334 | B1 * | 11/2019 | Mao | ..................... H05K 7/1489 |
| 11,197,387 | B2 * | 12/2021 | Liu | ....................... G11B 33/128 |
| 11,490,540 | B2 * | 11/2022 | Wu | ........................ H05K 7/1489 |
| 11,665,848 | B2 * | 5/2023 | Wang | ...................... G06F 1/187 |
|  |  |  |  | 312/330.1 |
| 2020/0396859 | A1 * | 12/2020 | Liu | ....................... G11B 33/128 |
| 2021/0385962 | A1 * | 12/2021 | Chang | .................... H05K 5/023 |
| 2022/0192046 | A1 * | 6/2022 | Wu | ........................ G06F 1/188 |
| 2022/0377926 | A1 * | 11/2022 | Wang | ...................... G06F 1/183 |

* cited by examiner

Primary Examiner — Kimberley S Wright
(74) Attorney, Agent, or Firm — Winston Hsu

(57) ABSTRACT

An engaging mechanism includes a casing, a first engaging member and a second engaging member. The casing has a first engaging recess and a second engaging recess. The first engaging member is slidably disposed in the casing and has a first engaging portion. The second engaging member is rotatably disposed in the casing and has a second engaging portion. When the first engaging member is located at a first lock position, the second engaging member is able to rotate between a second lock position and a second unlock position. When the second engaging member is located at the second unlock position and the first engaging member slides from the first lock position to a first unlock position, the first engaging member pushes the second engaging member to rotate toward the second lock position, such that the second engaging portion blocks the second engaging recess.

16 Claims, 17 Drawing Sheets

ENGAGING MECHANISM

BACKGROUND OF THE INVENTION

1. Field of the Invention

The invention relates to an engaging mechanism and, more particularly, to an engaging mechanism capable of ensuring correctness and safety of assembly and disassembly.

2. Description of the Prior Art

A server is used to serve various computers or portable electronic devices in a network system. At present, some servers are equipped with a plurality of detachable assembly modules (e.g. riser module, base module, etc.) to provide various functions for the servers. To maintain the assembly module conveniently, the assembly module is assembled and disassembled by an engaging mechanism. However, when the engaging mechanism does not lock the assembly module correctly, the assembly module may fall to be damaged or even hurt a user during assembly or disassembly.

SUMMARY OF THE INVENTION

The invention provides an engaging mechanism capable of ensuring correctness and safety of assembly and disassembly, so as to solve the aforesaid problems.

According to an embodiment of the invention, an engaging mechanism comprises a casing, a first engaging member and a second engaging member. The casing has a first engaging recess and a second engaging recess. The first engaging member is slidably disposed in the casing and the first engaging member has a first engaging portion. The second engaging member is rotatably disposed in the casing and the second engaging member has a second engaging portion. When the first engaging member is located at a first lock position, the first engaging portion blocks the first engaging recess and the second engaging member is able to rotate between a second lock position and a second unlock position. When the second engaging member is located at the second unlock position and the first engaging member slides from the first lock position to a first unlock position, the first engaging portion moves away from the first engaging recess and the first engaging member pushes the second engaging member to rotate toward the second lock position, such that the second engaging portion blocks the second engaging recess.

As mentioned in the above, the engaging mechanism of the invention is equipped with the slidable first engaging member and the rotatable second engaging member. The first engaging member is able to slide between the first lock position and the first unlock position to assemble or disassemble a first assembly module. When the first engaging member is located at the first lock position, the second engaging member is able to rotate between the second lock position and the second unlock position to assemble or disassemble a second assembly module. When the second engaging member is located at the second unlock position and the first engaging member slides from the first lock position to the first unlock position, the first engaging member pushes the second engaging member to rotate toward the second lock position. In other words, when the first engaging member is located at the first unlock position, the first engaging member restrains the second engaging member, such that the second engaging member is unable to rotate toward the second unlock position. At this time, if the second assembly module has been assembled on the casing, the second assembly module cannot be disassembled or, alternatively, if the second assembly module has not been assembled on the casing yet, the second assembly module cannot be assembled. Thus, only when the first engaging member locks the first assembly module on the casing correctly (i.e. the first engaging member is located at the first lock position), a user may operate the second engaging member to rotate between the second lock position and the second unlock position to assemble or disassemble the second assembly module. Accordingly, the invention can ensure correctness and safety of assembly and disassembly for the assembly module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
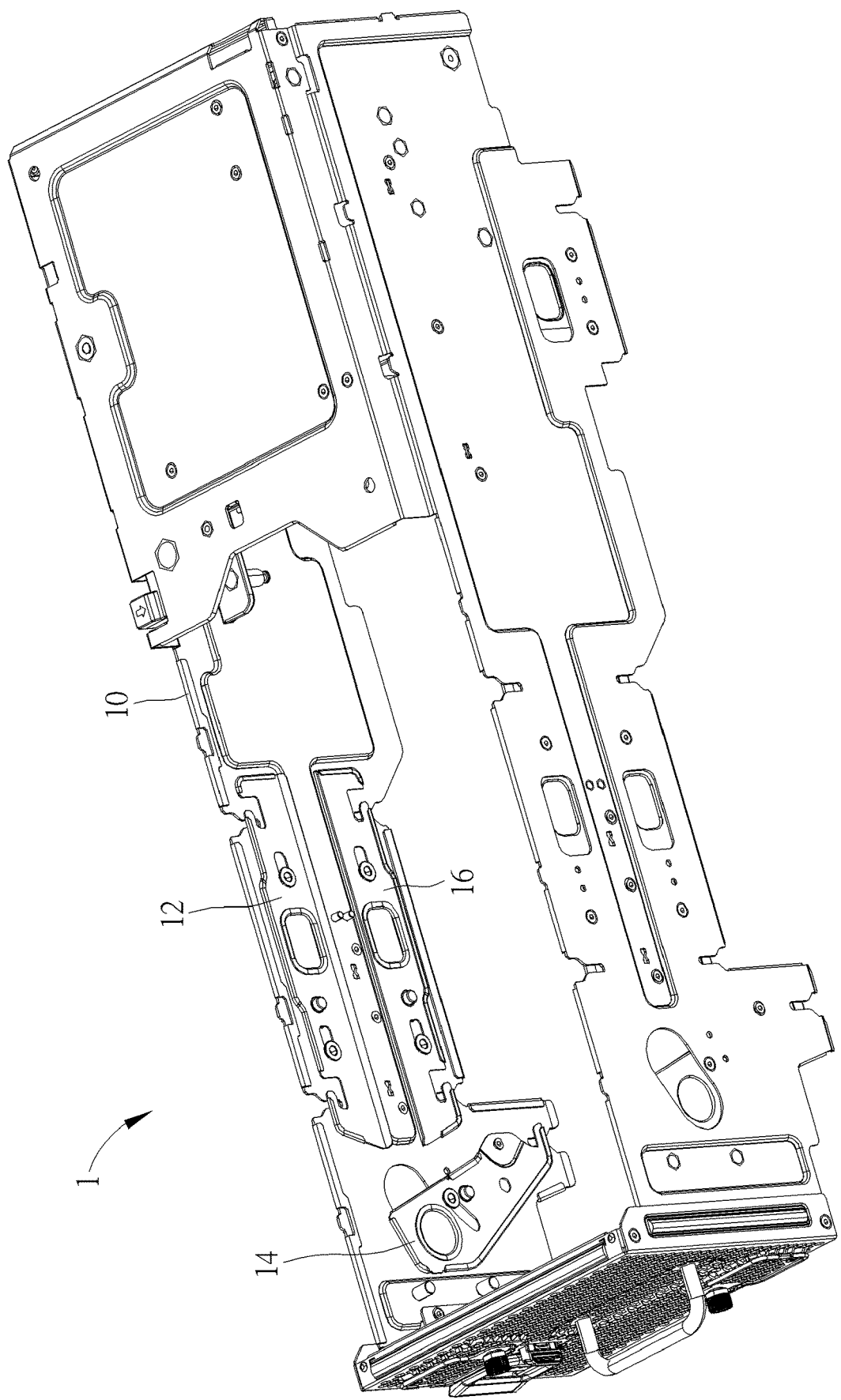
FIG. 1 is a perspective view illustrating an engaging mechanism according to an embodiment of the invention.
Figure 2:
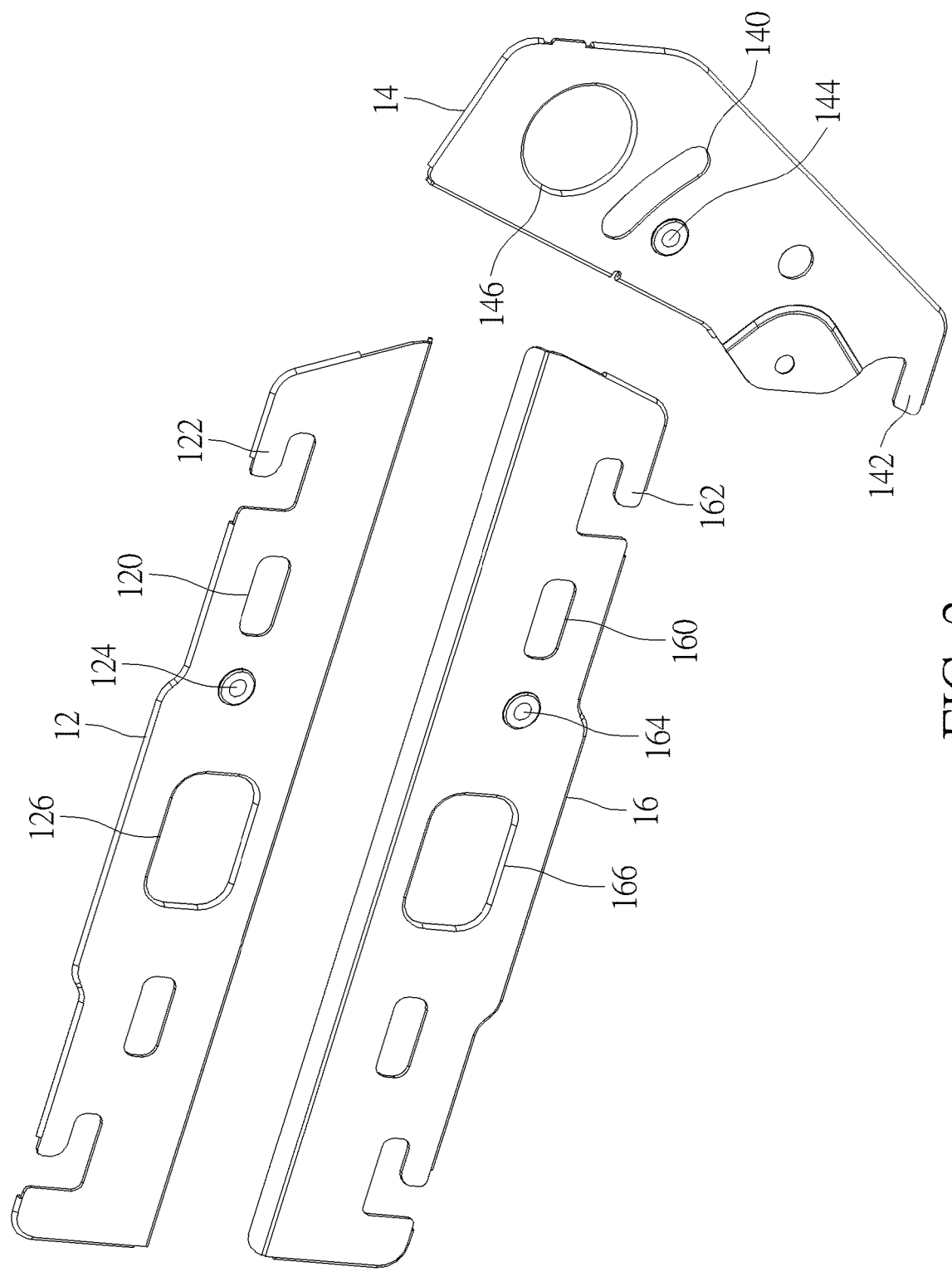
FIG. 2 is a perspective view illustrating a first engaging member, a second engaging member and a third engaging member shown in FIG. 1 from another viewing angle.
Figure 3:
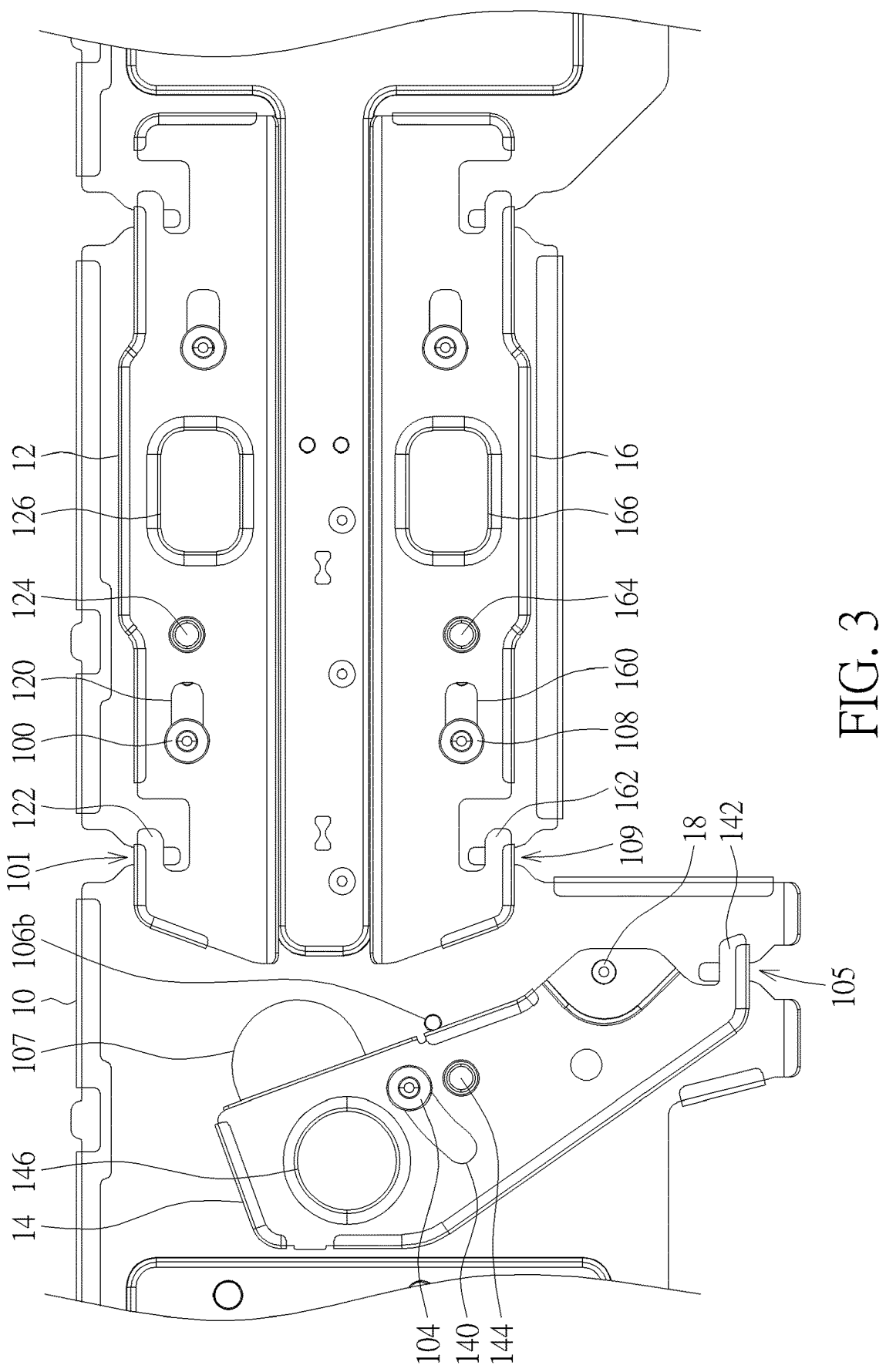
FIG. 3 is a side view illustrating a casing, the first engaging member, the second engaging member and the third engaging member shown in FIG. 1.
Figure 4:
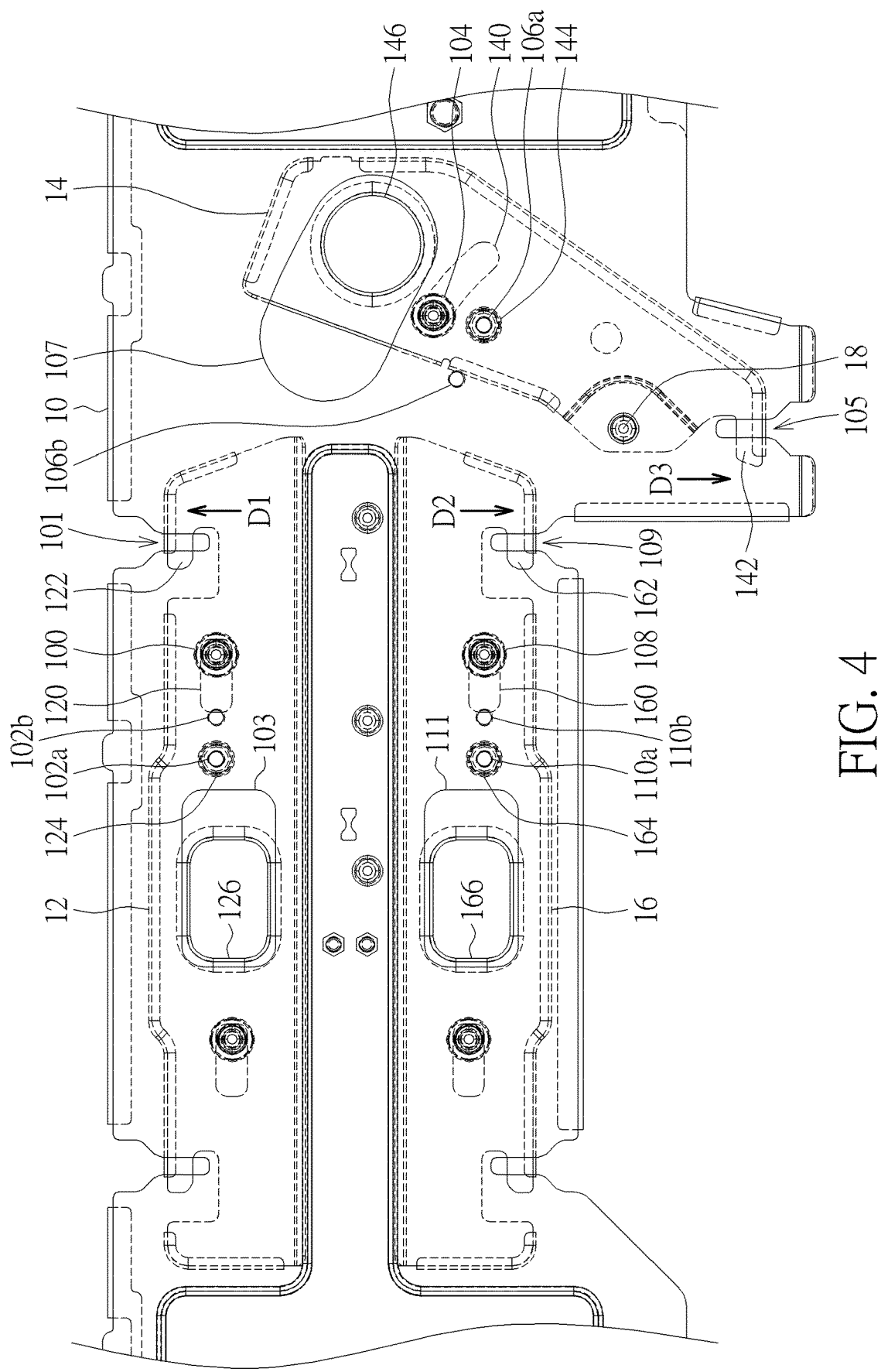
FIG. 4 is a side view illustrating the casing, the first engaging member, the second engaging member and the third engaging member shown in FIG. 1 from another viewing angle.
Figure 5:
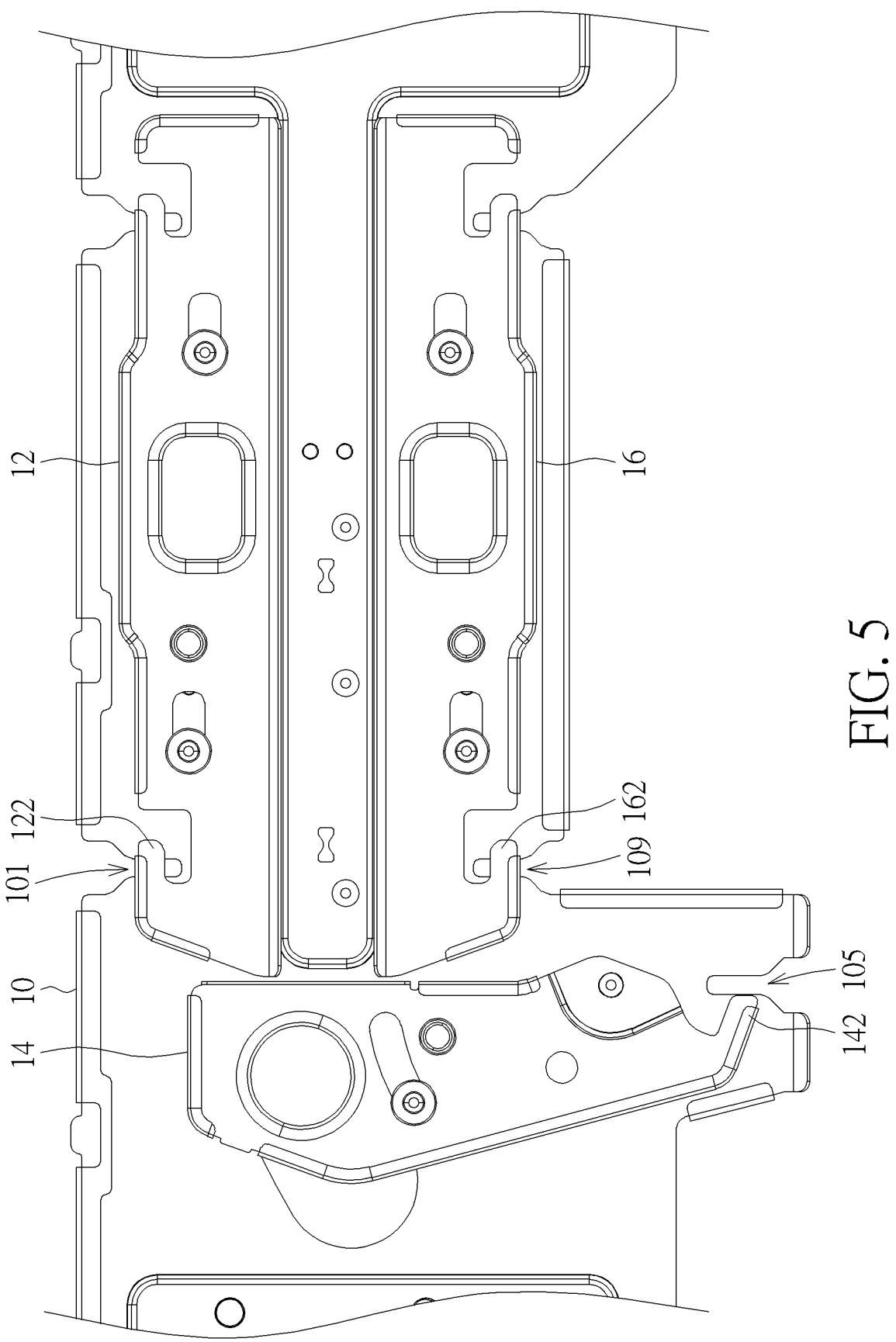
FIG. 5 is a side view illustrating the second engaging member shown in FIG. 3 rotating to a second unlock position.
Figure 6:
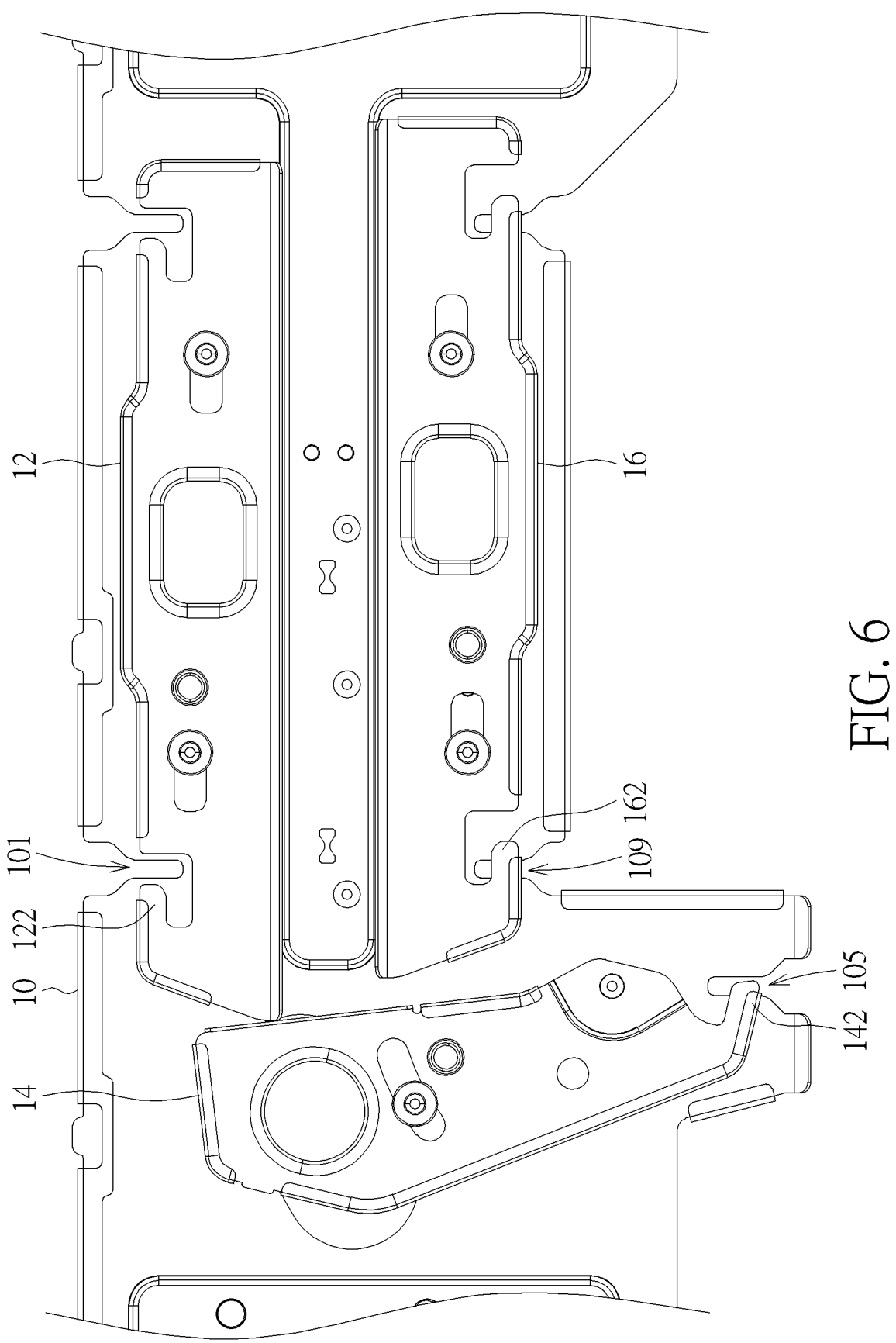
FIG. 6 is a side view illustrating the first engaging member shown in FIG. 5 sliding to a first unlock position.
Figure 7:
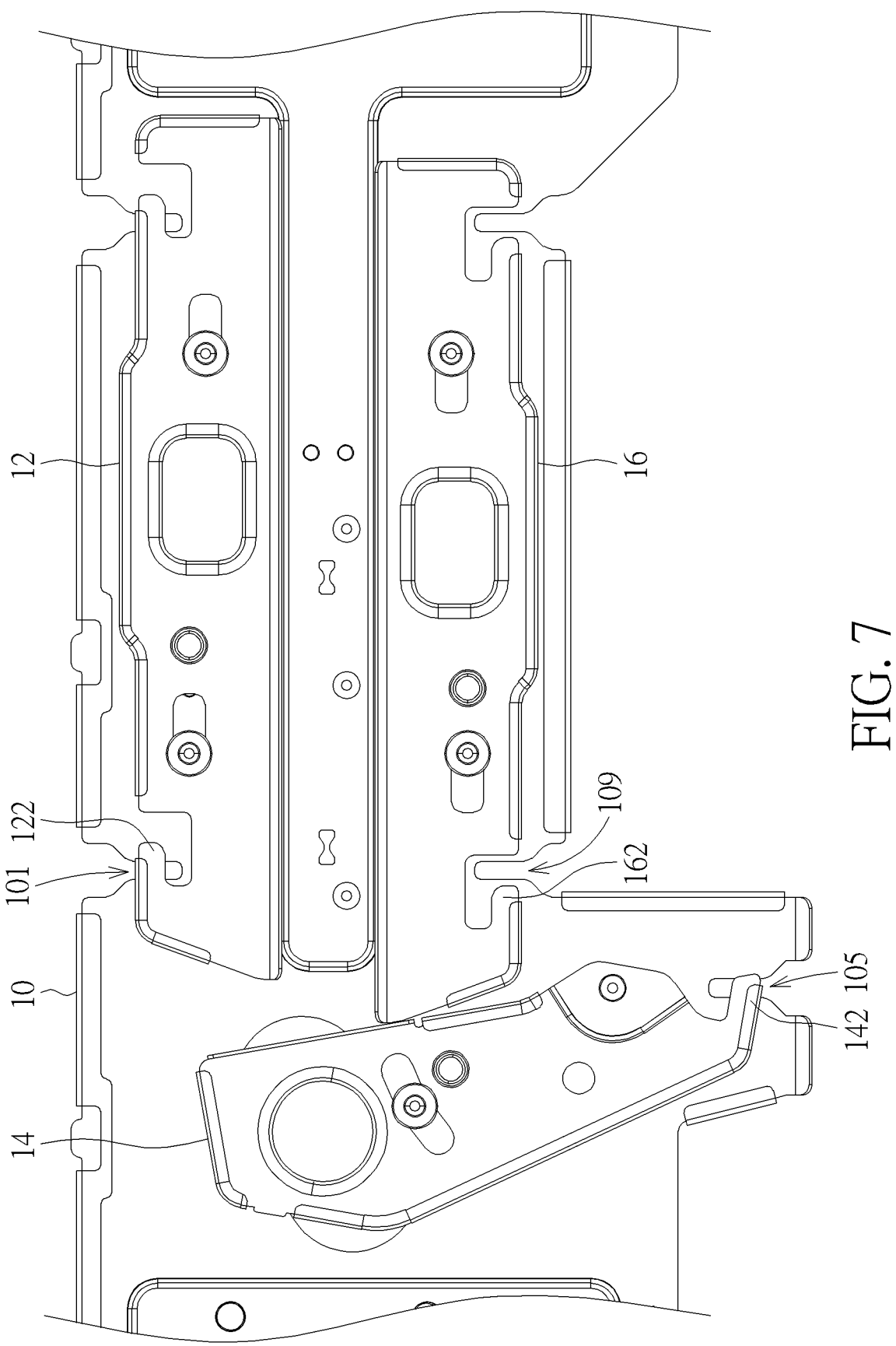
FIG. 7 is a side view illustrating the third engaging member shown in FIG. 5 sliding to a third unlock position.
Figure 8:
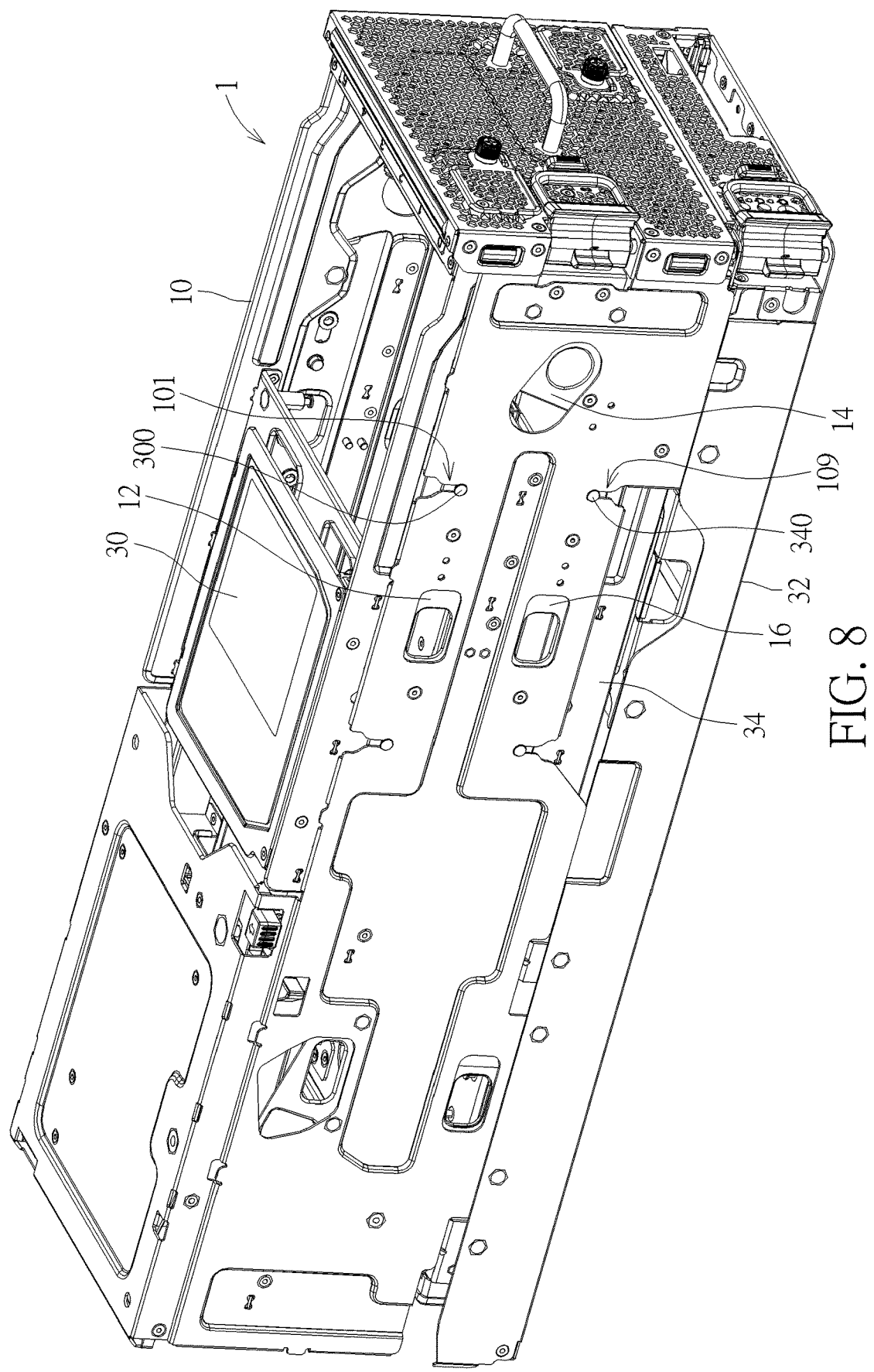
FIG. 8 is an assembly view illustrating the engaging mechanism shown in FIG. 1 engaging with a first assembly module, a second assembly module and a third assembly module.
Figure 9:
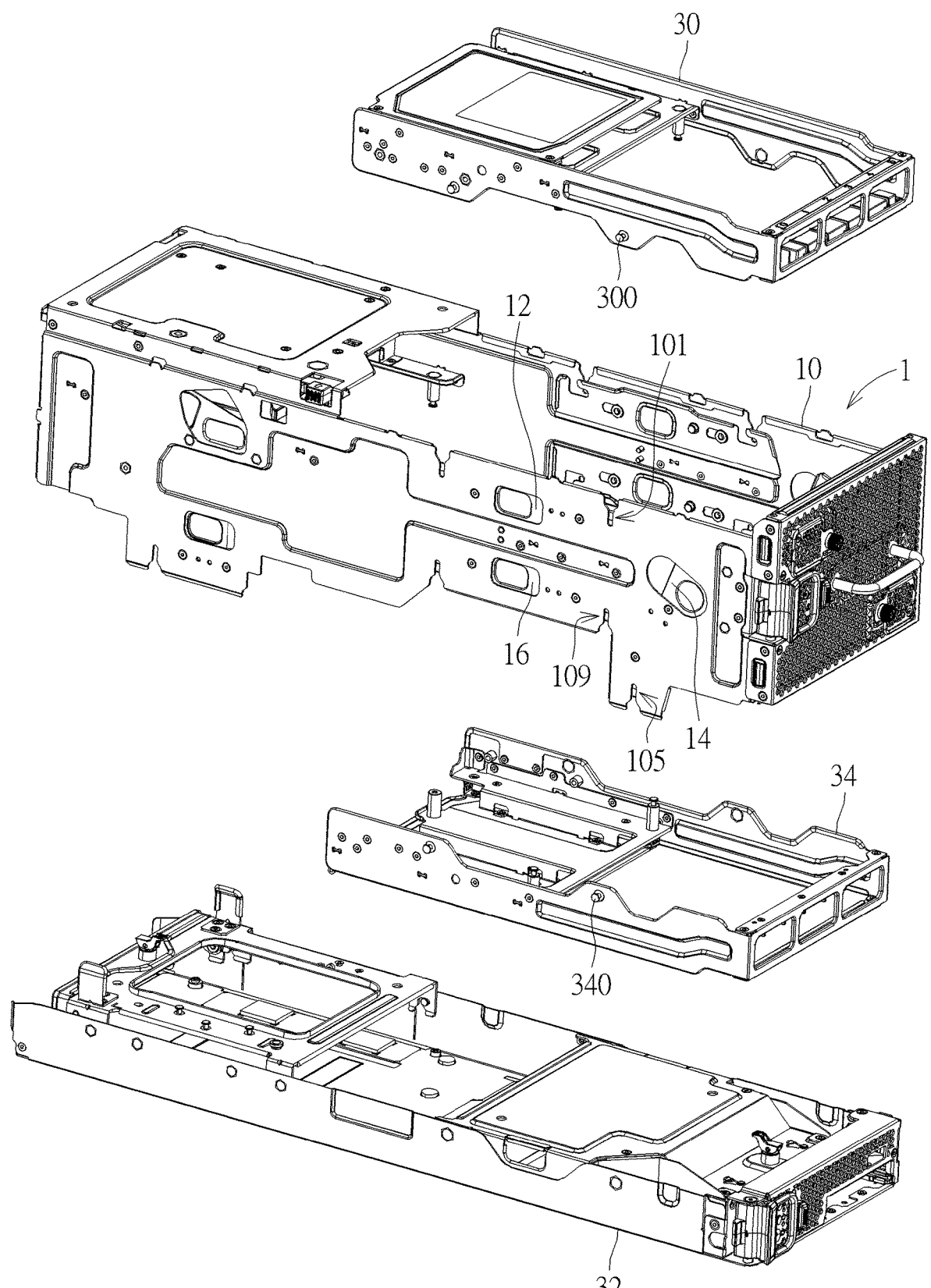
FIG. 9 is an exploded view illustrating the engaging mechanism, the first assembly module, the second assembly module and the third assembly module shown in FIG. 8.
Figure 10:
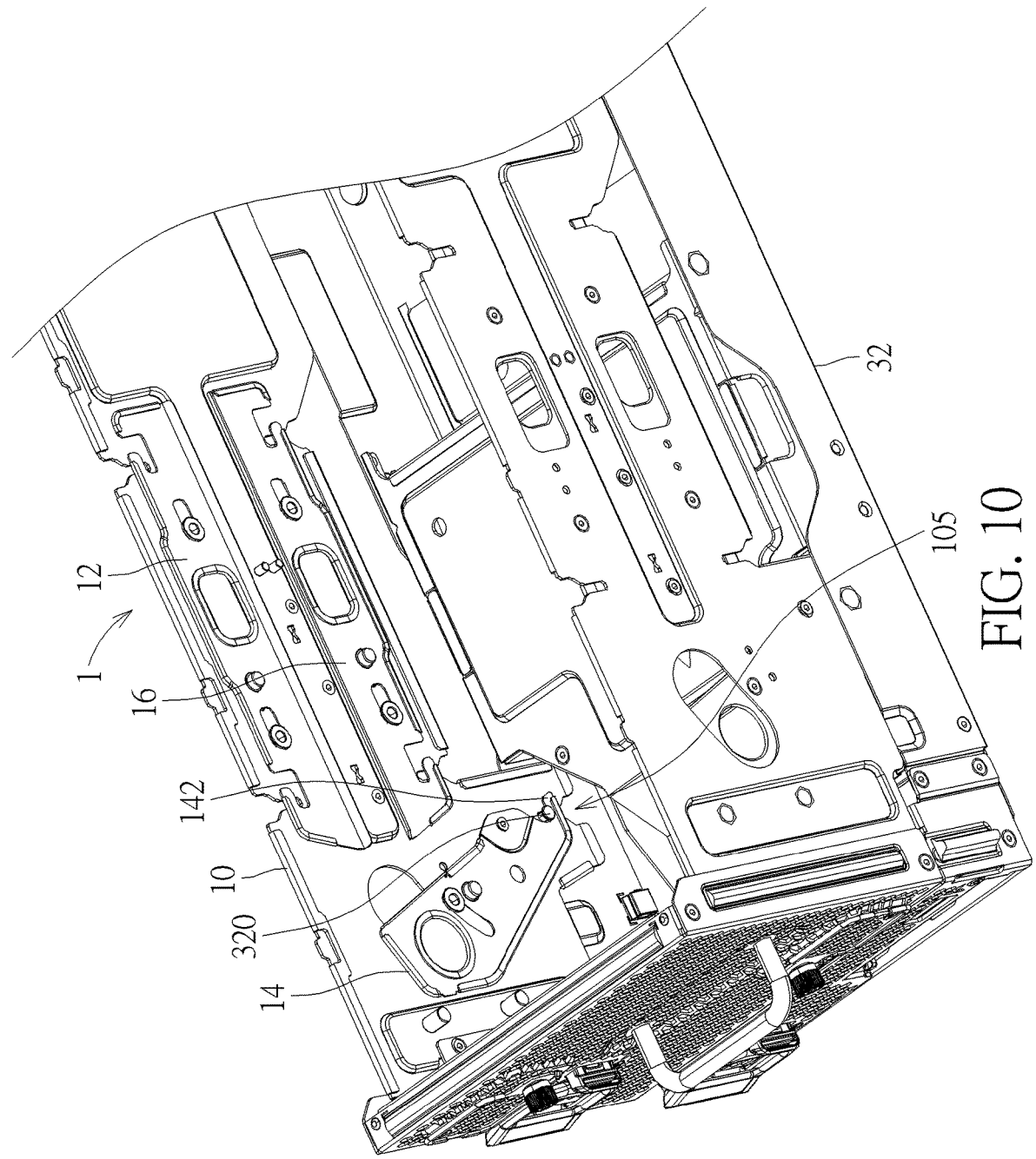
FIG. 10 is a perspective view illustrating the engaging mechanism shown in FIG. 8 engaging with the second assembly module from another viewing angle.

Referring to FIGS. 1 to 10, FIG. 1 is a perspective view illustrating an engaging mechanism 1 according to an embodiment of the invention, FIG. 2 is a perspective view illustrating a first engaging member 12, a second engaging member 14 and a third engaging member 16 shown in FIG. 1 from another viewing angle, FIG. 3 is a side view illustrating a casing 10, the first engaging member 12, the second engaging member 14 and the third engaging member 16 shown in FIG. 1, FIG. 4 is a side view illustrating the casing 10, the first engaging member 12, the second engaging member 14 and the third engaging member 16 shown in FIG. 1 from another viewing angle, FIG. 5 is a side view illustrating the second engaging member 14 shown in FIG. 3 rotating to a second unlock position, FIG. 6 is a side view illustrating the first engaging member 12 shown in FIG. 5 sliding to a first unlock position, FIG. 7 is a side view illustrating the third engaging member 16 shown in FIG. 5 sliding to a third unlock position, FIG. 8 is an assembly view illustrating the engaging mechanism 1 shown in FIG. 1 engaging with a first assembly module a second assembly module 32 and a third assembly module 34, FIG. 9 is an exploded view illustrating the engaging mechanism 1, the first assembly module 30, the second assembly module 32 and the third assembly module 34 shown in FIG. 8, and FIG. 10 is a perspective view illustrating the engaging mechanism 1 shown in FIG. 8 engaging with the second assembly module 32 from another viewing angle.

As shown in FIGS. 1 to 4, the engaging mechanism 1 comprises a casing 10, a first engaging member 12, a second engaging member 14 and a third engaging member 16. The engaging mechanism 1 may be applied to a server to engage with a plurality of detachable assembly modules (e.g. riser module, base module, etc.) on the casing 10, so as to provide various functions for the server. Furthermore, the engaging mechanism 1 may also be applied to other devices with engaging requirement according to practical applications. It should be noted that the structure of the engaging mechanism 1 of the invention is substantially symmetrical, so the first engaging member 12, the second engaging member 14, the third engaging member 16 and the corresponding components are arranged on both sides of the engaging mechanism 1.

The first engaging member 12 is slidably disposed in the casing 10. In this embodiment, the casing 10 may have a first sliding portion 100 and the first engaging member 12 may have a first sliding groove 120. The first sliding portion 100 is disposed in the first sliding groove 120, such that the first engaging member 12 may slide between a first lock position (as shown in FIG. 3) and a first unlock position (as shown in FIG. 6). In practical applications, two first sliding portions 100 and two first sliding grooves 120 may be disposed at appropriate positions of the casing 10 and the first engaging member 12, such that the first engaging member 12 may slide forward and backward with respect to the casing 10 by the cooperation between the first sliding portion 100 and the first sliding groove 120.

As shown in FIGS. 3 and 4, the casing 10 has a first engaging recess 101 and the first engaging member 12 has a first engaging portion 122. In practical applications, two first engaging recesses 101 and two first engaging portions 122 may be disposed at appropriate positions of the casing 10 and the first engaging member 12. When the first engaging member 12 is located at the first lock position, the first engaging portion 122 blocks the first engaging recess 101, as shown in FIG. 3. When the first engaging member 12 slides from the first lock position to the first unlock position, the first engaging portion 122 moves away from the first engaging recess 101, as shown in FIG. 6.

As shown in FIGS. 2 and 4, the casing 10 may have two first positioning holes 102a, 102b and the first engaging member 12 may have a first positioning portion 124, wherein the first positioning portion 124 engages with one of the two first positioning holes 102a, 102b to position the first engaging member 12 at the first lock position or the first unlock position. In this embodiment, when the first engaging member 12 is located at the first lock position, the first positioning portion 124 engages with the first positioning hole 102a to position the first engaging member 12 at the first lock position; and, when the first engaging member 12 is located at the first unlock position, the first positioning portion 124 engages with the first positioning hole 102b to position the first engaging member 12 at the first unlock position.

As shown in FIG. 4, the casing 10 may have a first through hole 103 and the first engaging member 12 may have a first operating portion 126, wherein the first operating portion 126 is exposed in the first through hole 103. Thus, a user may push the first operating portion 126 through the first through hole 103 to slide the first engaging member 12 between the first lock position and the first unlock position. In this embodiment, the first operating portion 126 may be, but is not limited to, a hole. In another embodiment, the first operating portion 126 may also be a protrusion or other structures for the user to operate.

The second engaging member 14 is rotatably disposed in the casing 10. In this embodiment, the second engaging member 14 may be pivotally connected to the casing 10 by a pivot 18, as shown in FIG. 3. Furthermore, the casing 10 may have a second sliding portion 104 and the second engaging member 14 may have a second sliding groove 140. The second sliding portion 104 is disposed in the second sliding groove 140, such that the second engaging member 14 may rotate between a second lock position (as shown in FIG. 3) and a second unlock position (as shown in FIG. 5).

As shown in FIGS. 3 and 4, the casing 10 has a second engaging recess 105 and the second engaging member 14 has a second engaging portion 142. When the second engaging member 14 is located at the second lock position, the second engaging portion 142 blocks the second engaging recess 105, as shown in FIG. 3. When the second engaging member 14 rotates from the second lock position to the second unlock position, the second engaging portion 142 moves away from the second engaging recess 105, as shown in FIG. 5.

As shown in FIGS. 2 and 4, the casing 10 may have two second positioning holes 106a, 106b and the second engaging member 14 may have a second positioning portion 144, wherein the second positioning portion 144 engages with one of the two second positioning holes 106a, 106b to position the second engaging member 14 at the second lock position or the second unlock position. In this embodiment, when the second engaging member 14 is located at the second lock position, the second positioning portion 144 engages with the second positioning hole 106a to position the second engaging member 14 at the second lock position; and, when the second engaging member 14 is located at the second unlock position, the second positioning portion 144 engages with the second positioning hole 106b to position the second engaging member 14 at the second unlock position.

As shown in FIG. 4, the casing 10 may have a second through hole 107 and the second engaging member 14 may have a second operating portion 146, wherein the second operating portion 146 is exposed in the second through hole 107. Thus, a user may push the second operating portion 146 through the second through hole 107 to rotate the second engaging member 14 between the second lock position and the second unlock position. In this embodiment, the second operating portion 146 may be, but is not limited to, a hole. In another embodiment, the second operating portion 146 may also be a protrusion or other structures for the user to operate.

The third engaging member 16 is slidably disposed in the casing 10. In this embodiment, the casing 10 may have a third sliding portion 108 and the third engaging member 16 may have a third sliding groove 160. The third sliding portion 108 is disposed in the third sliding groove 160, such that the third engaging member 16 may slide between a third lock position (as shown in FIG. 3) and a third unlock position (as shown in FIG. 7). In practical applications, two third sliding portions 108 and two third sliding grooves 160 may be disposed at appropriate positions of the casing 10 and the third engaging member 16, such that the third engaging member 16 may slide forward and backward with respect to the casing 10 by the cooperation between the third sliding portion 108 and the third sliding groove 160. In this embodiment, the first engaging member 12 and the third engaging member 16 may be disposed in parallel, i.e. the sliding directions of the first engaging member 12 and the third engaging member 16 may be parallel to each other.

As shown in FIGS. 3 and 4, the casing 10 has a third engaging recess 109 and the third engaging member 16 has a third engaging portion 162. In practical applications, two third engaging recesses 109 and two third engaging portions 162 may be disposed at appropriate positions of the casing 10 and the third engaging member 16. When the third engaging member 16 is located at the third lock position, the third engaging portion 162 blocks the third engaging recess 109, as shown in FIG. 3. When the third engaging member 16 slides from the third lock position to the third unlock position, the third engaging portion 162 moves away from the third engaging recess 109, as shown in FIG. 7. In this embodiment, an opening direction D1 of the first engaging recess 101 is opposite to an opening direction D3 of the third engaging recess 109, as shown in FIG. 4. Thus, a first assembly module 30 and a third assembly module 34 are respectively assembled to the casing 10 in opposite directions, as shown in FIGS. 8 and 9. Furthermore, an opening direction D2 of the second engaging recess 105 is identical to the opening direction D3 of the third engaging recess 109, as shown in FIG. 4. Thus, the third assembly module 34 and a second assembly module 32 are sequentially assembled to the casing 10 in identical directions, as shown in FIGS. 8 and 9.

As shown in FIGS. 2 and 4, the casing 10 may have two third positioning holes 110a, 110b and the third engaging member 16 may have a third positioning portion 164, wherein the third positioning portion 164 engages with one of the two third positioning holes 110a, 110b to position the third engaging member 16 at the third lock position or the third unlock position. In this embodiment, when the third engaging member 16 is located at the third lock position, the third positioning portion 164 engages with the third positioning hole 110a to position the third engaging member 16 at the third lock position; and, when the third engaging member 16 is located at the third unlock position, the third positioning portion 164 engages with the third positioning hole 110b to position the third engaging member 16 at the third unlock position.

As shown in FIG. 4, the casing 10 may have a third through hole 111 and the third engaging member 16 may have a third operating portion 166, wherein the third operating portion 166 is exposed in the third through hole 111. Thus, a user may push the third operating portion 166 through the third through hole 111 to slide the third engaging member 16 between the third lock position and the third unlock position. In this embodiment, the third operating portion 166 may be, but is not limited to, a hole. In another embodiment, the third operating portion 166 may also be a protrusion or other structures for the user to operate.

As shown in FIGS. 3 and 5, when the first engaging member 12 is located at the first lock position and the third engaging member 16 is located at the third lock position, the first engaging portion 122 blocks the first engaging recess 101, the third engaging portion 162 blocks the third engaging recess 109, and the second engaging member 14 is able to rotate between the second lock position (as shown in FIG. 3) and the second unlock position (as shown in FIG. 5).

As shown in FIGS. 5 and 6, when the second engaging member 14 is located at the second unlock position and the first engaging member 12 slides from the first lock position to the first unlock position, the first engaging portion 122 moves away from the first engaging recess 101 and the first engaging member 12 pushes the second engaging member 14 to rotate toward the second lock position, such that the second engaging portion 142 blocks the second engaging recess 105.

As shown in FIGS. 5 and 7, when the second engaging member 14 is located at the second unlock position and the third engaging member 16 slides from the third lock position to the third unlock position, the third engaging portion 162 moves away from the third engaging recess 109 and the third engaging member 16 pushes the second engaging member 14 to rotate toward the second lock position, such that the second engaging portion 142 blocks the second engaging recess 105.

As shown in FIGS. 8 to 10, the engaging mechanism 1 may be used to engage with a first assembly module 30, a second assembly module 32 and a third assembly module 34. When the engaging mechanism 1 is applied to a server, the first assembly module 30 and the third assembly module 34 may be riser modules of the server, and the second assembly module 32 may be a base module of the server. In practical applications, the riser module may be equipped with a solid state drive (SSD), an expansion card and/or other electronic components, the base module may be equipped with a server board, a riser cable module, a network interface card (NIC) and/or other electronic components, and the casing 10 may be equipped with a switchboard, a riser card module and/or other electronic components.

In this embodiment, the first assembly module 30 has a first protruding portion 300, the second assembly module 32 has a second protruding portion 320, and the third assembly module 34 has a third protruding portion 340. It should be noted that the number and positions of the first protruding portions 300, the second protruding portions 320 and the third protruding portions 340 correspond to the number and positions of the first engaging recesses 101, the second engaging recesses 105 and the third engaging recesses 109.

When a user wants to assemble or disassemble the first assembly module 30, the user may operate the first engaging member 12 to slide to the first unlock position (as shown in FIG. 6) first. Then, the user may place the first protruding portion 300 of the first assembly module 30 into the first engaging recess 101 or take it out from the first engaging recess 101. When the first engaging member 12 is located at the first unlock position, the first engaging member 12 restrains the second engaging member 14, such that the second engaging member 14 is unable to rotate toward the second unlock position. At this time, if the second assembly module 32 has been assembled on the casing 10, the second assembly module 32 cannot be disassembled or, alternatively, if the second assembly module 32 has not been assembled on the casing 10 yet, the second assembly module 32 cannot be assembled. After the first protruding portion 300 of the first assembly module 30 is placed into the first engaging recess 101, the user may operate the first engaging member 12 to slide to the first lock position (as shown in FIG. 3), such that the first protruding portion 300 is engaged in the first engaging recess 101 by the first engaging portion 122 (as shown in FIG. 8), so as to lock the first assembly module 30 on the casing 10.

Similarly, when the user wants to assemble or disassemble the third assembly module 34, the user may operate the third engaging member 16 to slide to the third unlock position (as shown in FIG. 7) first. Then, the user may place the third protruding portion 340 of the third assembly module 34 into the third engaging recess 109 or take it out from the third engaging recess 109. When the third engaging member 16 is located at the third unlock position, the third engaging member 16 restrains the second engaging member 14, such that the second engaging member 14 is unable to rotate toward the second unlock position. At this time, if the second assembly module 32 has been assembled on the casing 10, the second assembly module 32 cannot be disassembled or, alternatively, if the second assembly module 32 has not been assembled on the casing 10 yet, the second assembly module 32 cannot be assembled. After the third protruding portion 340 of the third assembly module 34 is placed into the third engaging recess 109, the user may operate the third engaging member 16 to slide to the third lock position (as shown in FIG. 3), such that the third protruding portion 340 is engaged in the third engaging recess 109 by the third engaging portion 162 (as shown in FIG. 8), so as to lock the third assembly module 34 on the casing 10.

Thus, only when the first engaging member 12 and the third engaging member 16 lock the first assembly module 30 and the third assembly module 34 on the casing 10 respectively and correctly (i.e. the first engaging member 12 is located at the first lock position and the third engaging member 16 is located at the third lock position), the user may operate the second engaging member 14 to rotate between the second lock position and the second unlock position to assemble or disassemble the second assembly module 32. Accordingly, the invention can ensure correctness and safety of assembly and disassembly for the assembly module. After the second protruding portion 320 of the second assembly module 32 is placed into the second engaging recess 105, the user may operate the second engaging member 14 to rotate to the second lock position (as shown in FIG. 3), such that the second protruding portion 320 is engaged in the second engaging recess 105 by the second engaging portion 142 (as shown in FIG. 10), so as to lock the second assembly module 32 on the casing 10.

In another embodiment, the aforesaid first engaging member 12 or third engaging member 16 may be omitted from the engaging mechanism 1 of the invention according to practical applications.

Figure 11:
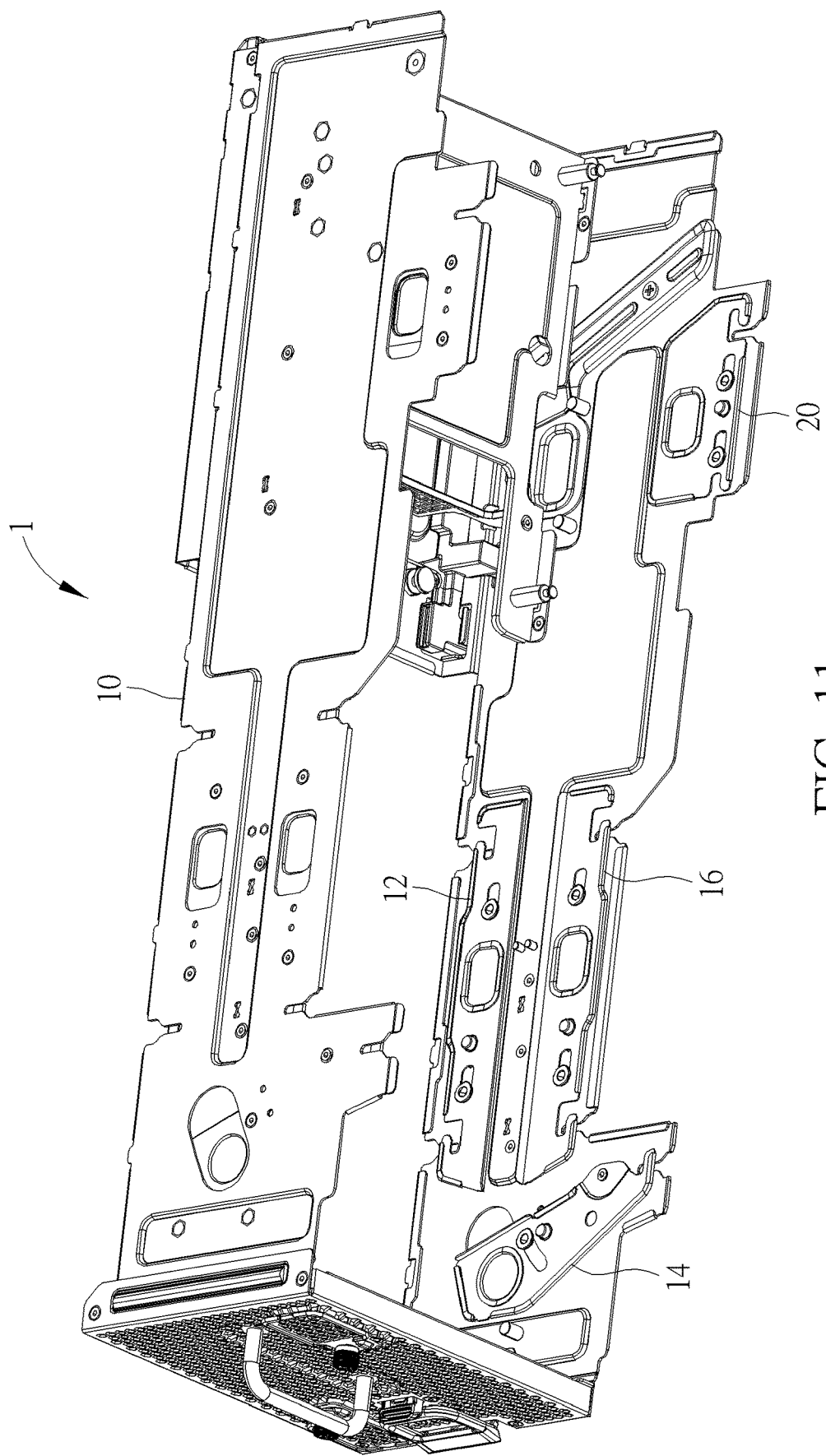
FIG. 11 is a perspective view illustrating the engaging mechanism shown in FIG. 1 from another viewing angle.

Referring to FIG. 11, FIG. 11 is a perspective view illustrating the engaging mechanism 1 shown in FIG. 1 from another viewing angle.

As shown in FIG. 11, the engaging mechanism 1 may further comprise a fourth engaging member 20, wherein the fourth engaging member 20 and the corresponding components are arranged on both sides of the engaging mechanism 1. The fourth engaging member 20 is also slidably disposed in the casing 10 and opposite to the second engaging member 14. The second engaging member 14 and the fourth engaging member 20 respectively engage with opposite ends of the second assembly module 32 to lock the second assembly module 32 on the casing 10. It should be noted that the detailed structure and principle of the fourth engaging member 20 are substantially the same as those of the aforesaid first engaging member 12 and third engaging member 16, so the repeated explanation will not be depicted herein again.

Figure 12:
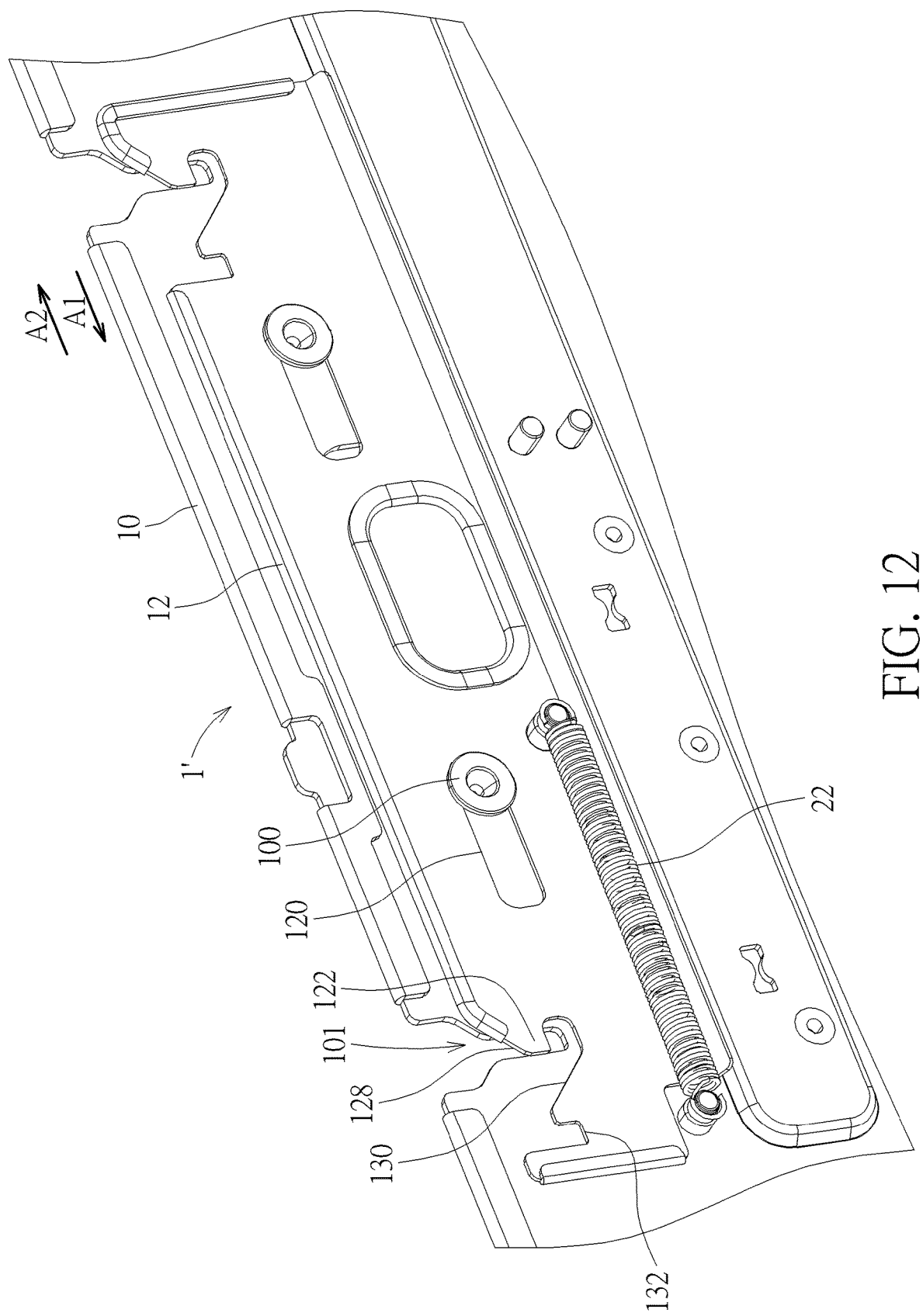
FIG. 12 is a partial perspective view illustrating an engaging mechanism according to another embodiment of the invention.
Figure 13:
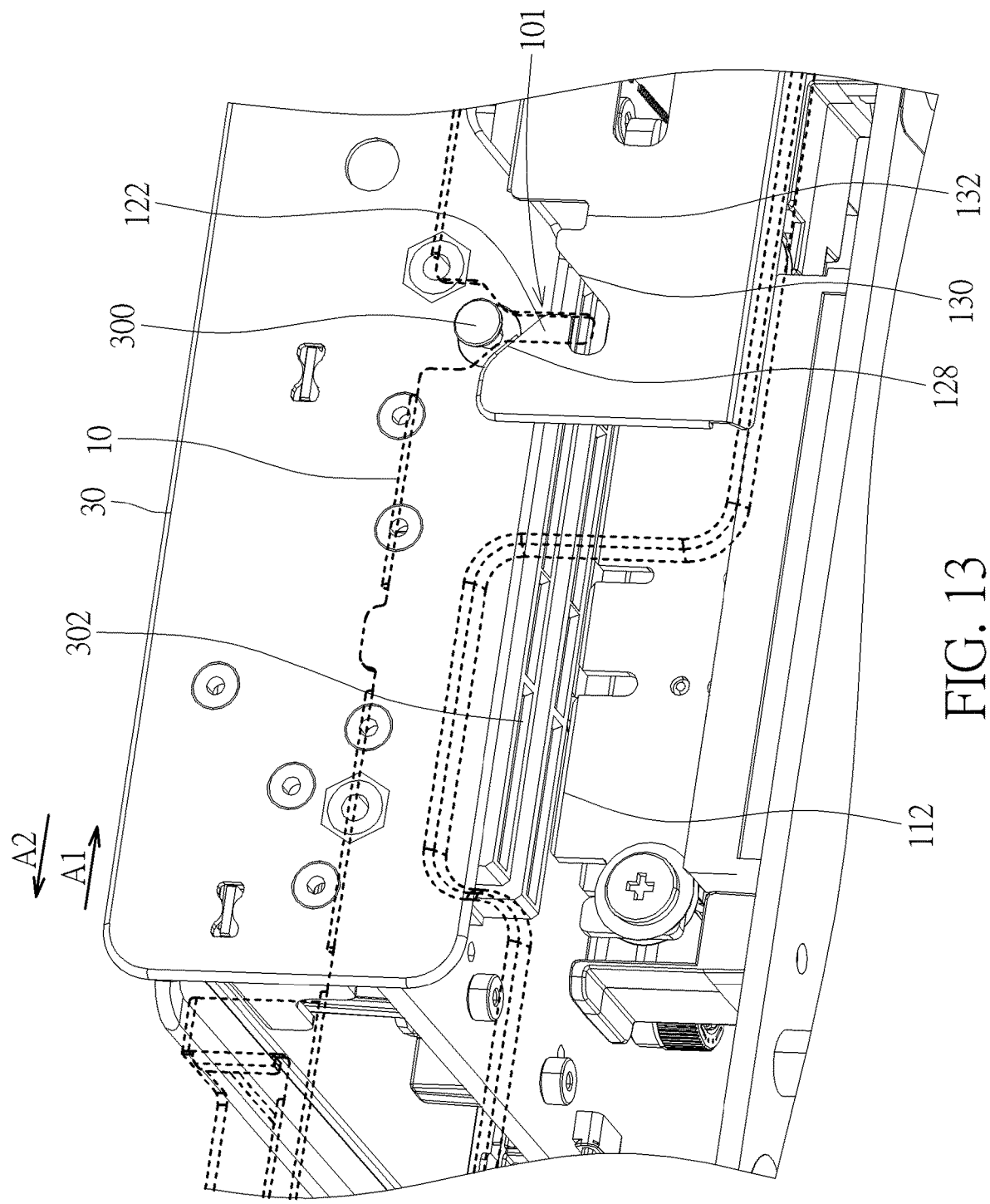
FIGS. 13 to 15 are partial perspective views illustrating a process of assembling the first assembly module to the engaging mechanism shown in FIG. 12.
Figure 14:
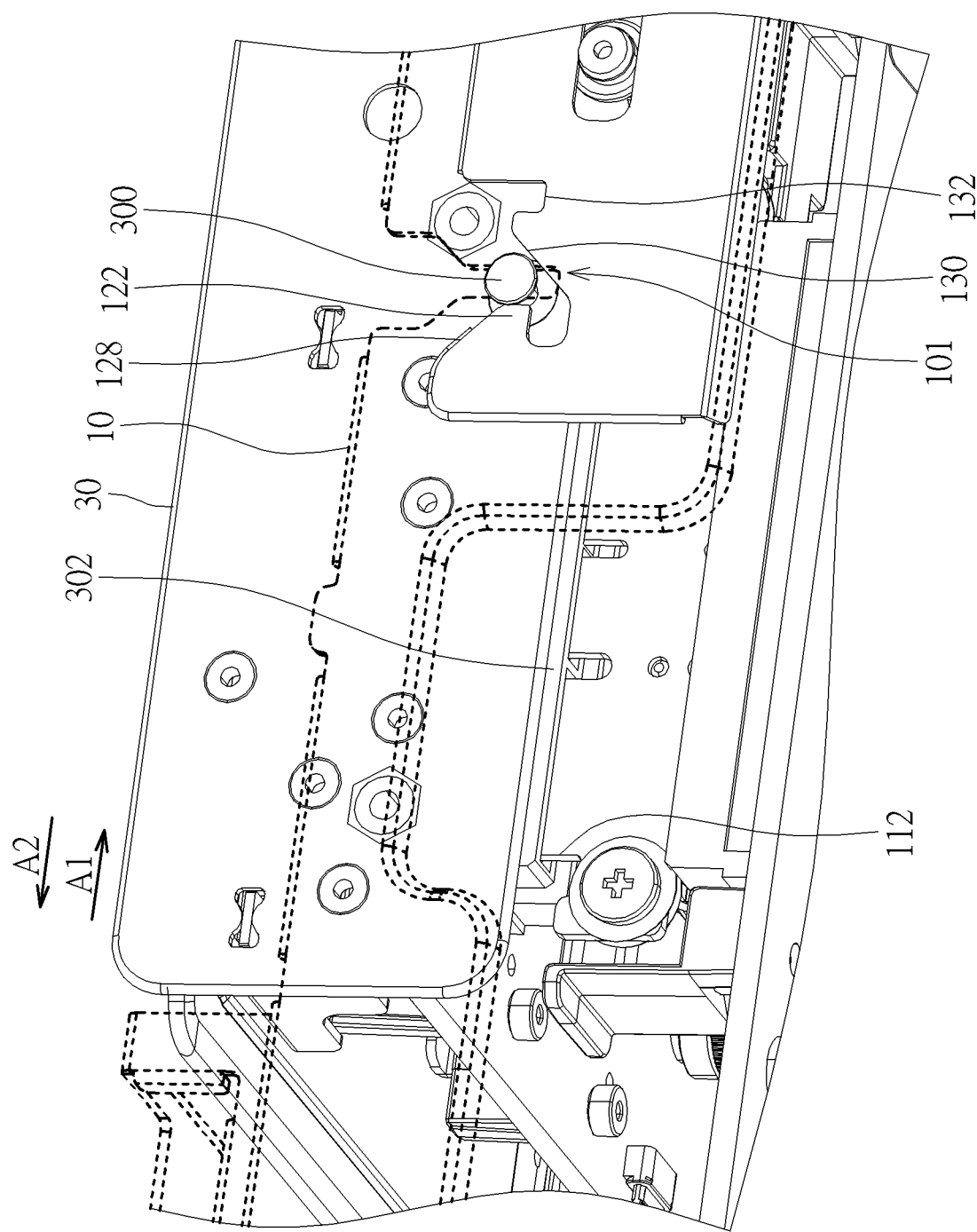
Figure 15:
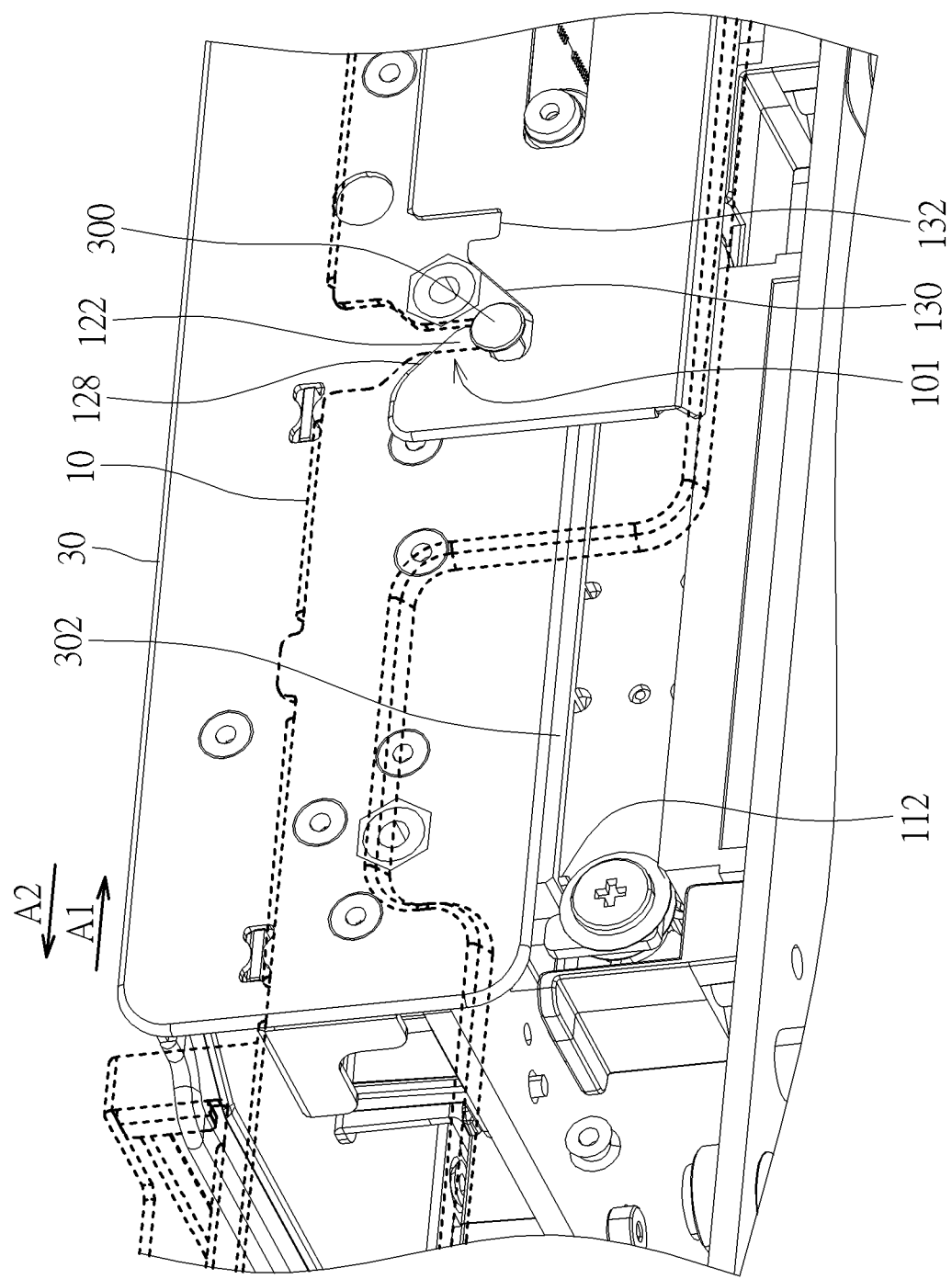
Figure 16:
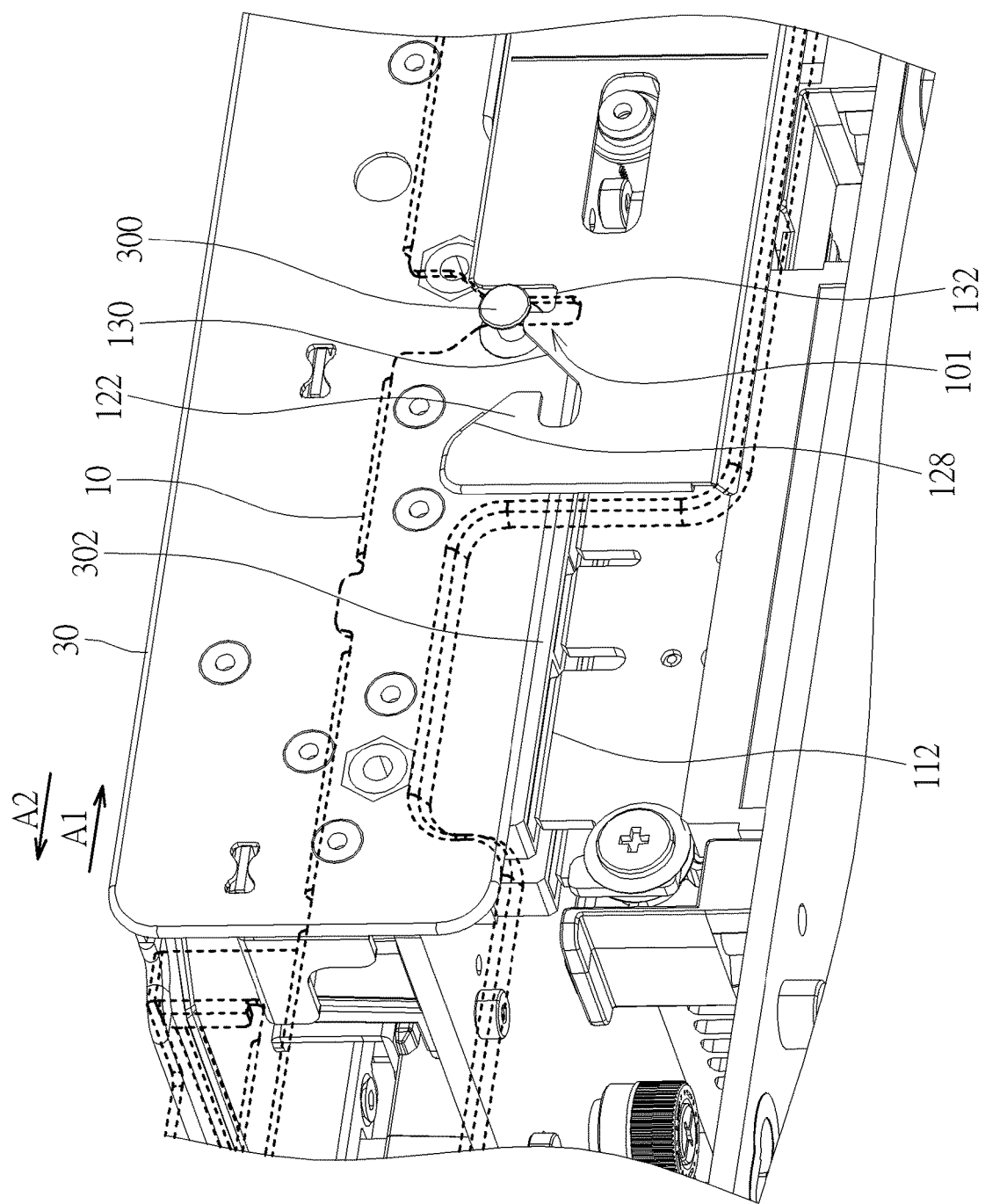
FIGS. 16 to 17 are partial perspective views illustrating a process of disassembling the first assembly module from the engaging mechanism shown in FIG. 12.
Figure 17:
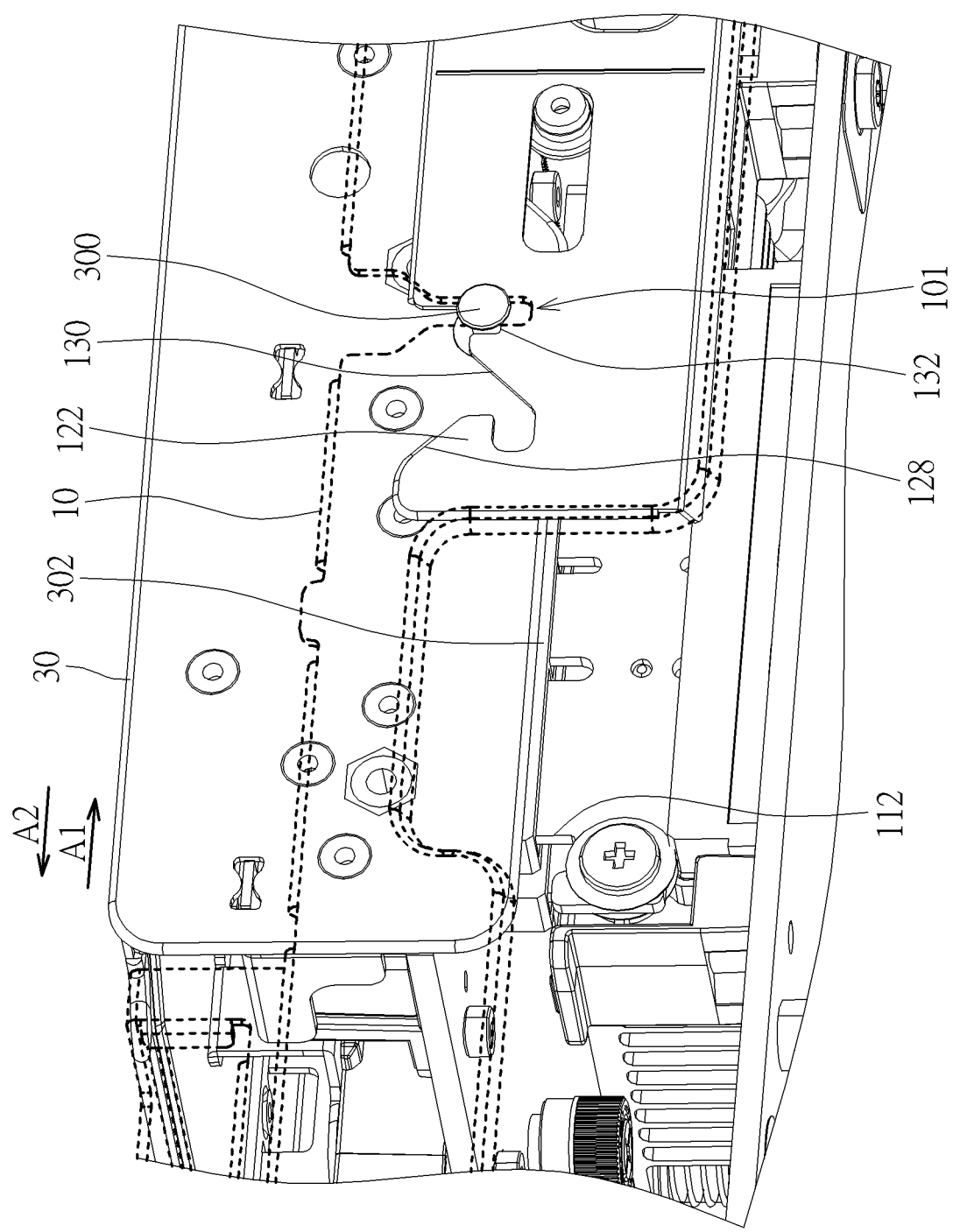

Referring to FIGS. 12 to 17, FIG. 12 is a partial perspective view illustrating an engaging mechanism 1' according to another embodiment of the invention, FIGS. 13 to 15 are partial perspective views illustrating a process of assembling the first assembly module to the engaging mechanism 1' shown in FIG. 12, and FIGS. 16 to 17 are partial perspective views illustrating a process of disassembling the first assembly module 30 from the engaging mechanism 1' shown in FIG. 12. It should be noted that, to clearly show the interaction between the first engaging member 12 and the first assembly module 30, the casing 10 shown in FIGS. 13 to 17 is illustrated by a dotted line.

As shown in FIG. 12, the engaging mechanism 1' further comprises an elastic member 22, wherein opposite ends of the elastic member 22 are respectively connected to the casing 10 and the first engaging member 12. The elastic member 22 is used to keep the first engaging member 12 toward the first lock position (i.e. toward a direction of an arrow A1). In this embodiment, the elastic member 22 may be, but is not limited to, a tension spring. The elastic member 22 may also be other components capable of keeping the first engaging member 12 toward the first lock position according to practical applications. In this embodiment, the first engaging portion 122 of the first engaging member 12 has a first inclined guiding surface 128 and the first engaging member 12 has a second inclined guiding surface 130 and a restraining recess 132, wherein the second inclined guiding surface 130 is opposite to the first engaging portion 122 and the restraining recess 132 is adjacent to the second inclined guiding surface 130.

The first engaging member 12 of the engaging mechanism 1' may be used to engage with the aforesaid first assembly module 30, wherein the first assembly module 30 has the first protruding portion 300. As shown in FIGS. 13 and 14, when the first protruding portion 300 of the first assembly module 30 is placed into the first engaging recess 101 of the casing 10, the first protruding portion 300 pushes the first inclined guiding surface 128, such that the first engaging portion 122 moves away from the first engaging recess 101 in a direction of an arrow A2. Furthermore, when the first protruding portion 300 pushes the first inclined guiding surface 128, the first engaging member 12 stretches the elastic member 22 shown in FIG. 12 in the direction of the arrow A2. Then, as shown in FIG. 15, when the first protruding portion 300 completely enters the first engaging recess 101, the elastic member 22 shown in FIG. 12 returns the first engaging member 12 in the direction of the arrow A1, such that the first protruding portion 300 is engaged in the first engaging recess 101 by the first engaging portion 122 to lock the first assembly module 30 on the casing 10. In other words, as long as the user places the first protruding portion 300 of the first assembly module 30 into the first engaging recess 101 of the casing 10, the invention can achieve auto-lock function by the arrangement of the first inclined guiding surface 128 and the elastic member 22.

When the user wants to disassemble the first assembly module the user needs to operate the first engaging member 12 to slide from the first lock position (as shown in FIG. 15) toward the first unlock position (as shown in FIG. 17), i.e. slide in the direction the arrow A2. When the first engaging member 12 slides from the first lock position toward the first unlock position, the second inclined guiding surface 130 pushes the first protruding portion 300, such that the first protruding portion 300 moves in a direction away from the first engaging recess 101, as shown in FIG. 16. Then, when the first protruding portion 300 moves over the second inclined guiding surface 130, the first protruding portion 300 sinks into the restraining recess 132 due to the weight of the first assembly module (as shown in FIG. 17) to restrain the first engaging member 12 from returning toward the first lock position. Then, the user may disassemble the first assembly module 30 from the casing 10. After the first protruding portion 300 disengages from the restraining recess 132, the elastic member 22 shown in FIG. 12 returns the first engaging member 12 in the direction of the arrow A1, such that the first engaging portion 122 again blocks the first engaging recess 101.

In this embodiment, the first assembly module 30 may have a first connector 302 and the casing 10 may be equipped with a second connector 112. In this embodiment, the first connector 302 may be, but is not limited to, a slot connector and the second connector 112 may be, but is not limited to, a card edge connector. When the first assembly module 30 is assembled in the casing 10, the first connector 302 is connected to the second connector 112, as shown in FIG. 15. When the second inclined guiding surface 130 of the first engaging member 12 pushes the first protruding portion 300 of the first assembly module 30, the first assembly module 30 drives the first connector 302 to move in a direction away from the second connector 112, such that the first connector 320 at least partially disengages from the second connector 112, as shown in FIG. 16. Accordingly, it allows the user to save effort when taking out the first assembly module 30 later.

Still further, the first engaging member 12 of the engaging mechanism 1 shown in FIG. 1 may be replaced by the first engaging member 12 of the engaging mechanism 1' shown in FIG. 12. When the first engaging member 12 of the engaging mechanism 1' is located at the first unlock position, the first engaging member 12 of the engaging mechanism 1' may also restrain the second engaging member 14, such that the second engaging member 14 is unable to rotate toward the second unlock position. Needless to say, the third engaging member 16 of the engaging mechanism 1 shown in FIG. 1 may also be replaced by the first engaging member 12 of the engaging mechanism 1' shown in FIG. 12.

As mentioned in the above, the engaging mechanism of the invention is equipped with the slidable first engaging member, the rotatable second engaging member and the slidable third engaging member. The first engaging member is able to slide between the first lock position and the first unlock position to assemble or disassemble the first assembly module. The third engaging member is able to slide between the third lock position and the third unlock position to assemble or disassemble the third assembly module. When the first engaging member is located at the first lock position and the third engaging member is located at the third lock position, the second engaging member is able to rotate between the second lock position and the second unlock position to assemble or disassemble the second assembly module. When the second engaging member is located at the second unlock position and the first engaging member slides from the first lock position to the first unlock position, the first engaging member pushes the second engaging member to rotate toward the second lock position. When the second engaging member is located at the second unlock position and the third engaging member slides from the third lock position to the third unlock position, the third engaging member also pushes the second engaging member to rotate toward the second lock position. In other words, when the first engaging member is located at the first unlock position and/or the third engaging member is located at the third unlock position, the first engaging member and/or the third engaging member restrains the second engaging member, such that the second engaging member is unable to rotate toward the second unlock position. At this time, if the second assembly module has been assembled on the casing, the second assembly module cannot be disassembled or, alternatively, if the second assembly module has not been assembled on the casing yet, the second assembly module cannot be assembled. Thus, only when the first engaging member and the third engaging member lock the first assembly module and the third assembly module on the casing respectively and correctly (i.e. the first engaging member is located at the first lock position and the third engaging member is located at the third lock position), a user may operate the second engaging member to rotate between the second lock position and the second unlock position to assemble or disassemble the second assembly module. Accordingly, the invention can ensure correctness and safety of assembly and disassembly for the assembly module. It should be noted that the aforesaid first engaging member or third engaging member may be omitted from the engaging mechanism of the invention according to practical applications. Furthermore, the invention may further achieve auto-lock function by the arrangement of the first inclined guiding surface and the elastic member.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An engaging mechanism comprising:
   a casing having a first engaging recess, a second engaging recess and a third engaging recess;
   a first engaging member slidably disposed in the casing, the first engaging member having a first engaging portion;
   a second engaging member rotatably disposed in the casing, the second engaging member having a second engaging portion; and
   a third engaging member slidably disposed in the casing, the third engaging member having a third engaging portion;
   wherein, when the first engaging member is located at a first lock position, the first engaging portion blocks the first engaging recess and the second engaging member is able to rotate between a second lock position and a second unlock position;
   wherein, when the second engaging member is located at the second unlock position and the first engaging member slides from the first lock position to a first unlock position, the first engaging portion moves away from the first engaging recess and the first engaging member pushes the second engaging member to rotate toward the second lock position, such that the second engaging portion blocks the second engaging recess;

wherein, when the first engaging member is located at the first lock position and the third engaging member is located at a third lock position, the first engaging portion blocks the first engaging recess, the third engaging portion blocks the third engaging recess, and the second engaging member is able to rotate between the second lock position and the second unlock position;

wherein, when the second engaging member is located at the second unlock position and the third engaging member slides from the third lock position to a third unlock position, the third engaging portion moves away from the third engaging recess and the third engaging member pushes the second engaging member to rotate toward the second lock position, such that the second engaging portion blocks the second engaging recess.

2. The engaging mechanism of claim 1, wherein the casing has a first sliding portion, the first engaging member has a first sliding groove, and the first sliding portion is disposed in the first sliding groove.

3. The engaging mechanism of claim 1, wherein the casing has two first positioning holes, the first engaging member has a first positioning portion, and the first positioning portion engages with one of the two first positioning holes to position the first engaging member at the first lock position or the first unlock position.

4. The engaging mechanism of claim 1, wherein the casing has a first through hole, the first engaging member has a first operating portion, and the first operating portion is exposed in the first through hole.

5. The engaging mechanism of claim 1, wherein the second engaging member is pivotally connected to the casing by a pivot, the casing has a second sliding portion, the second engaging member has a second sliding groove, and the second sliding portion is disposed in the second sliding groove.

6. The engaging mechanism of claim 1, wherein the casing has two second positioning holes, the second engaging member has a second positioning portion, and the second positioning portion engages with one of the two second positioning holes to position the second engaging member at the second lock position or the second unlock position.

7. The engaging mechanism of claim 1, wherein the casing has a second through hole, the second engaging member has a second operating portion, and the second operating portion is exposed in the second through hole.

8. The engaging mechanism of claim 1, wherein the first engaging member and the third engaging member are disposed in parallel and an opening direction of the first engaging recess is opposite to an opening direction of the third engaging recess.

9. The engaging mechanism of claim 1, wherein the casing has a third sliding portion, the third engaging member has a third sliding groove, and the third sliding portion is disposed in the third sliding groove.

10. The engaging mechanism of claim 1, wherein the casing has two third positioning holes, the third engaging member has a third positioning portion, and the third positioning portion engages with one of the two third positioning holes to position the third engaging member at the third lock position or the third unlock position.

11. The engaging mechanism of claim 1, wherein the casing has a third through hole, the third engaging member has a third operating portion, and the third operating portion is exposed in the third through hole.

12. The engaging mechanism of claim 1, further comprising an elastic member, opposite ends of the elastic member being respectively connected to the casing and the first engaging member, the elastic member keeping the first engaging member toward the first lock position, an assembly module having a protruding portion, and the first engaging portion having a first inclined guiding surface; wherein, when the protruding portion is placed into the first engaging recess, the protruding portion pushes the first inclined guiding surface, such that the first engaging portion moves away from the first engaging recess; wherein, when the protruding portion completely enters the first engaging recess, the elastic member returns the first engaging member, such that the protruding portion is engaged in the first engaging recess by the first engaging portion.

13. The engaging mechanism of claim 12, wherein the elastic member is a tension spring; wherein, when the protruding portion pushes the first inclined guiding surface, the first engaging member stretches the elastic member.

14. The engaging mechanism of claim 12, wherein the first engaging member has a second inclined guiding surface and the second inclined guiding surface is opposite to the first engaging portion; wherein, when the first engaging member slides from the first lock position toward the first unlock position, the second inclined guiding surface pushes the protruding portion, such that the protruding portion moves in a direction away from the first engaging recess.

15. The engaging mechanism of claim 14, wherein the assembly module has a first connector and the casing is equipped with a second connector; wherein, when the assembly module is assembled in the casing, the first connector is connected to the second connector; wherein, when the second inclined guiding surface pushes the protruding portion, the assembly module drives the first connector to move in a direction away from the second connector.

16. The engaging mechanism of claim 14, wherein the first engaging member has a restraining recess and the restraining recess is adjacent to the second inclined guiding surface; wherein, when the protruding portion moves over the second inclined guiding surface, the protruding portion sinks into the restraining recess to restrain the first engaging member from returning toward the first lock position.

* * * * *